US009673715B2

(12) United States Patent
Hasegawa et al.

(10) Patent No.: US 9,673,715 B2
(45) Date of Patent: Jun. 6, 2017

(54) SWITCHING ELEMENT DRIVING POWER SUPPLY CIRCUIT

(71) Applicant: Kabushiki Kaisha Toshiba, Minato-ku (JP)

(72) Inventors: Ryuta Hasegawa, Hino (JP); Yosuke Nakazawa, Kunitachi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 35 days.

(21) Appl. No.: 14/979,406

(22) Filed: Dec. 27, 2015

(65) Prior Publication Data
US 2016/0141965 A1 May 19, 2016

Related U.S. Application Data

(63) Continuation of application No. PCT/JP2014/068130, filed on Jul. 8, 2014.

(30) Foreign Application Priority Data

Jul. 12, 2013 (JP) .................................. 2013-146475

(51) Int. Cl.
*H02M 1/08* (2006.01)
*H02M 3/335* (2006.01)
(Continued)

(52) U.S. Cl.
CPC ......... *H02M 3/33507* (2013.01); *H02M 1/08* (2013.01); *H02M 1/32* (2013.01);
(Continued)

(58) Field of Classification Search
CPC ........... H02M 1/08; H02M 2001/0074; H02M 2001/0006; H03K 2217/0081
See application file for complete search history.

(56) References Cited

U.S. PATENT DOCUMENTS 6,441,652 B1 * 8/2002 Qian ................ H03K 17/04123
327/108
2004/0246753 A1* 12/2004 Kunow ................ H02M 3/285
363/65
(Continued)

FOREIGN PATENT DOCUMENTS

CH         592979 A5 * 11/1977 .............. H02J 7/022
JP      2006-25591       1/2006
(Continued)

OTHER PUBLICATIONS

International Search Report issued Aug. 26, 2014 in PCT/JP2014/068130, filed Jul. 8, 2014 (with English Translation).
(Continued)

*Primary Examiner* — Harry Behm
(74) *Attorney, Agent, or Firm* — Oblon, McClelland, Maier & Neustadt, L.L.P.

(57) ABSTRACT

According to one embodiment, there is provided a switching element driving power supply circuit that converts a main circuit voltage into a driving voltage of power-converting switching elements. The circuit includes a plurality of insulating power supplies, and a plurality of switching element driving power supply units. The insulating power supplies have respective direct-current input circuit ends connected in series, respective input-side circuits and output-side circuits insulated from each other, and respective output circuit ends connected in parallel. The power supply units are connected in parallel with the output circuit ends, and supplying power to the gate driving circuits of the power conversion switching elements.

12 Claims, 3 Drawing Sheets

(51) Int. Cl.
　　*H02M 7/538*　　(2007.01)
　　*H02M 1/32*　　(2007.01)
　　*H02M 1/00*　　(2006.01)

(52) U.S. Cl.
　　CPC .... *H02M 7/538* (2013.01); *H02M 2001/0006* (2013.01); *H02M 2001/0074* (2013.01); *H03K 2217/0081* (2013.01)

(56) References Cited

U.S. PATENT DOCUMENTS

| | | | | |
|---|---|---|---|---|
| 2009/0080225 A1* | 3/2009 | Dijkhuizen | ........... | H02M 7/537 363/65 |
| 2009/0086391 A1* | 4/2009 | Gauthier, Jr. | ....... | H01L 27/0285 361/56 |
| 2009/0261793 A1* | 10/2009 | Urakabe | ............... | H02J 7/0016 323/282 |
| 2010/0207450 A1 | 8/2010 | Ogawa et al. | | |
| 2010/0302820 A1 | 12/2010 | Nakamura et al. | | |
| 2012/0051099 A1* | 3/2012 | Funaba | ................... | H02M 1/08 363/21.17 |

FOREIGN PATENT DOCUMENTS

| | | |
|---|---|---|
| JP | 2010-193596 | 9/2010 |
| JP | 2010-279093 | 12/2010 |
| JP | 2010-284029 | 12/2010 |

OTHER PUBLICATIONS

Written Opinion issued Aug. 26, 2014 in PCT/JP2014/068130, filed Jul. 8, 2014.

* cited by examiner

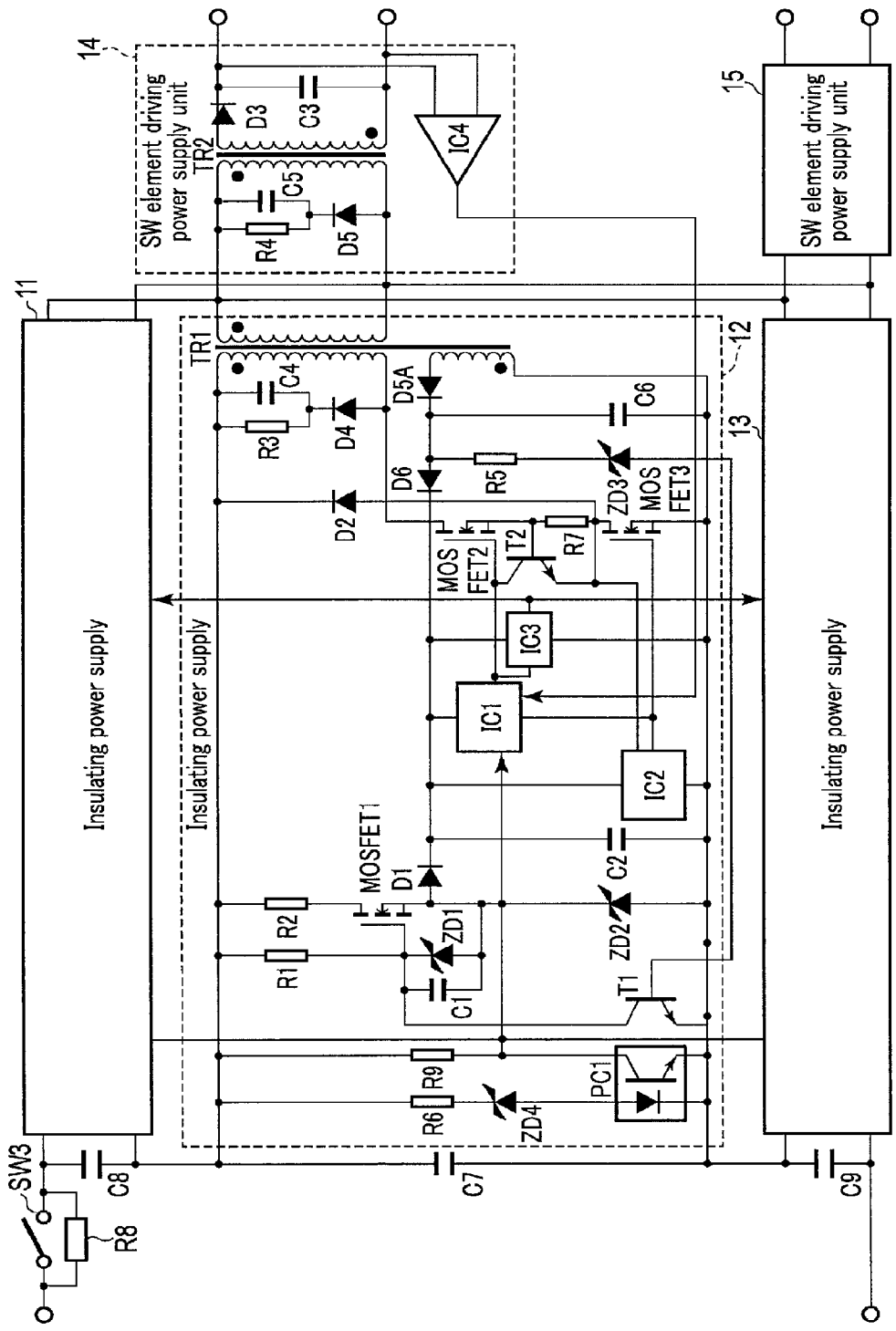
F I G. 2

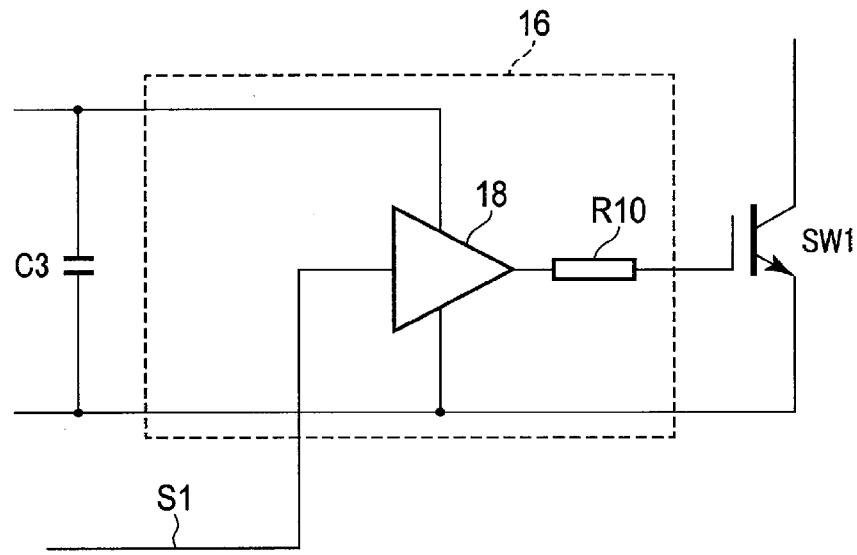
F I G. 3
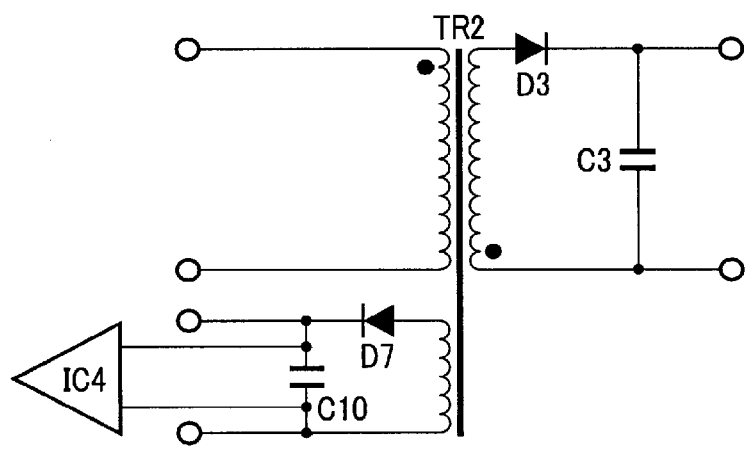
F I G. 4

&& # SWITCHING ELEMENT DRIVING POWER SUPPLY CIRCUIT

CROSS-REFERENCE TO RELATED APPLICATIONS

This application is a Continuation Application of PCT Application No. PCT/JP2014/068130, filed Jul. 8, 2014 and based upon and claiming the benefit of priority from Japanese Patent Application No. 2013-146475, filed Jul. 12, 2013, the entire contents of all of which are incorporated herein by reference.

FIELD

Embodiments described herein relate to a switching element driving power supply circuit that converts a power supply voltage of a main circuit of a power converter into a power supply voltage of a gate driving circuit of a power-converting switching element.

BACKGROUND

A semiconductor power converter that converts a high voltage has a high voltage to ground. For this reason, a high cost is involved in satisfying the insulation property of semiconductor power converters, and such converters therefore have large volumes. In particular, to supply a gate driving voltage to switching elements having a high voltage to ground, it is necessary to provide a transformer having a high voltage to ground, to secure a fixed insulation distance. For this reason, it becomes difficult to supply a gate driving voltage to switching elements when the main circuit voltage of the semiconductor power converter exceeds 10 kV. When the gate power can be supplied from the main circuit, a switching element driving power supply circuit can be configured with a withstand voltage level for one switching element. This facilitates supply of a gate power. For this reason, the prior art includes a method for supplying the gate driving power to switching elements by dropping a voltage from the main circuit via a resistor.

In the conventional structure described above, the resistor of the power supply circuit has an increased loss due to Joule heat in comparison with the power supplied to the switching elements. This structure increases the volume of the resistor, and increases the standby power consumption of the power converter.

BRIEF DESCRIPTION OF DRAWINGS

FIG. 2 is a diagram illustrating an example of a detailed configuration of a switching element driving power supply circuit according to an embodiment;

FIG. 3 is a diagram illustrating a configuration example of an SW element driving circuit according to the embodiment; and FIG. 4 is a diagram illustrating another example for detecting an output voltage of an SW element driving power supply according to the embodiment.

DETAILED DESCRIPTION

Figure 1:
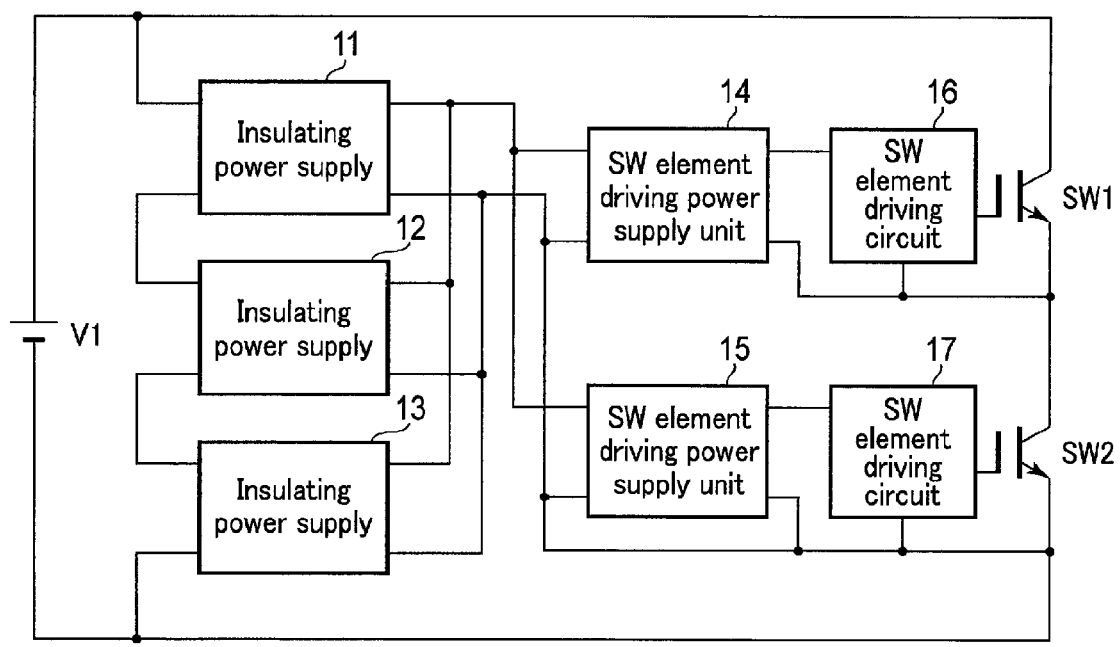
FIG. 1 is a diagram illustrating an example of a schematic configuration of a power supply circuit to drive gates of two-series switching elements, SW1 and SW2.

In general, according to one embodiment, there is provided a switching element driving power supply circuit that converts a main circuit voltage of a power converter into a driving voltage of power-converting switching elements. The switching element driving power supply circuit includes a plurality of insulating power supplies, and a plurality of switching element driving power supply units. The insulating power supplies have respective direct-current input circuit ends connected in series, respective input-side circuits and output-side circuits insulated from each other, and respective output circuit ends connected in parallel. The switching element driving power supply units are connected in parallel with the output circuit ends connected in parallel, and supplying power to the gate driving circuits of the power conversion switching elements of the power converter.

The following is an explanation of an embodiment of a switching element driving power supply circuit for a power converter, with reference to drawings.

FIG. 1 is a diagram illustrating an example of a schematic configuration of a power supply circuit to drive gates of two-series switching elements, SW1 and SW2. The switching elements SW1 and SW2 are switching elements that are used for, for example, an upper arm and a lower arm of each phase in an inverter. Insulating power supplies 11, 12, and 13 are connected at an input side in series, to equally divide an input direct-current power supply voltage V1 into three. Each of the insulating power supplies 11, 12, and 13 is a power supply in which an input-side circuit is insulated from an output-side circuit. Because the input side structures of the insulating power supplies 11, 12, and 13 are connected in series, a voltage applied to each insulating power supply is reduced. This structure enables reduction in withstand voltage of a MOSFET used for power conversion in the insulating power supply. This structure enables use of a general-purpose product as a MOSFET. The present embodiment illustrates the case where the input direct-current power supply voltage is 2100 V, and the voltage applied to each insulating power supply is 700 V.

Each of the insulating power supplies 11, 12, and 13 converts the input direct-current power supply voltage into an alternating-current voltage, and outputs the voltage. The output ends of the insulating power supplies 11, 12, and 13 are connected in parallel, and thereby the same alternating-current voltage is output. For this reason, the alternating-current output MOSFETs formed in the respective insulating power supplies 11, 12, and 13 are required to be driven at the same timing. Setting the driving timings to be equal makes the power converted in the insulating power supplies 11, 12, and 13 equal to each other, and produces the effect of equalizing the input direct-current power supply voltage of the insulating power supplies 11, 12, and 13.

The alternating-current voltages are rectified in switching element driving power supply units (SW element driving power supply units) 14 and 15, and converted into direct-current voltages. The input ends of the SW element driving power supply units 14 and 15 are connected in parallel with the output ends of the insulating power supplies 11, 12, and 13 that are connected in parallel. The SW element driving power supply units 14 and 15 supply driving power to SW element driving circuits 16 and 17, respectively, to turn on/off the switching elements SW1 and SW2.

FIG. 2 illustrates a detailed configuration of the switching element driving power supply circuit according to the present embodiment. In particular, FIG. 2 illustrates detailed structures of the insulating power supply 12 that functions as a master, and the SW element driving power supply unit 14 or the SW element driving power supply unit 15.

Resistors R1 and R2, capacitors C1 and C2, a diode D1, Zener diodes ZD1 and ZD2, and a MOSFET1 are constituent elements of a charge starting circuit. A current flows through the resistor R1 and the Zener diodes ZD1 and ZD2. The voltage of the capacitor C1 that is connected in parallel with the Zener diode ZD1 is equal to the Zener voltage of the Zener diode ZD1. The Zener voltage is applied between the gate and the source of the MOSFET1. Thereby, the MOSFET1 is changed to a conducting state, and the capacitor C2 is charged through the resistor R2, the MOSFET1, and the diode D1. The voltage of the capacitor C2 is equal to a voltage obtained by subtracting a voltage drop value of the diode D1 from the voltage of the Zener diode ZD2, and the power is supplied to IC1, IC2, and IC3. The resistance value and the wattage of the resistor R2 are determined from the startup voltage of the insulating power supply 12 and the power consumption in startup of the IC1, IC2, and IC3. In the present embodiment, the resistance value and the wattage of the resistor R2 are determined such that the power consumed in startup of IC1, IC2, and IC3 can be sufficiently supplied when the startup voltage is 100 V.

A resistor R8 and a SW3 that are connected in parallel are constituent elements of a rush current prevention circuit. When the power is supplied, SW3 is turned off, a current flows into the insulating power supply 12 through the resistor R8 and a capacitor C8, and a capacitor C7 serving as an input capacitor of the insulating power supply 12 is charged. The voltage of the capacitor C7 rises from 0 V to 700 V in accordance with a time constant that is determined based on the resistor R8 and the capacitors C7, C8, and C9. Suppose that the capacitors C7, C8, and C9 have the same capacity. When the voltage of the capacity C7 rises close to 100 V serving as the startup voltage, the above charge starting circuit operates, the power supply voltage is supplied to the IC1, IC2, and IC3, which start operating, and the insulating power supply 12 outputs an alternating-current voltage as described later. When the voltage of the capacitor C7 exceeds 100 V or thereabouts, a charge stopping circuit operates as described later, the MOSFET1 is turned off, and the power supply voltages of the IC1, IC2, and IC3 are generated based on the voltage generated in a tertiary winding of a transformer TR1. When the voltage of the capacitor C7 reaches 700 V, the SW3 is turned on, and the power supply current flows into the insulating power supplies 11, 12, and 13 via the SW3, without flowing through the resistor R8.

The IC2, a diode D2, and a MOSFET3 are constituent elements of an overcurrent protection circuit. The IC2 starts the MOSFET3. Because the MOSFET3 is a switch for overcurrent protection, the MOSFET3 is always in a conducting state under normal conditions. When the MOSFET2 has a short circuit failure, the current of the MOSFET2 continues to rise. When the current exceeds an overcurrent set value, the IC2 latches off the MOSFET3, to reduce the current of the MOSFET2. The IC2 continuously detects a drain/source voltage Vds of the MOSFET3. When the voltage Vds exceeds a predetermined value, the IC2 latches off the MOSFET3. In the processing, the diode D2 protects the MOSFET3 from the overvoltage.

The IC1, the MOSFET2, transformers TR1 and TR2, a diode D3, and a capacitor C3 are constituent elements of a flyback power supply. The IC1 drives the MOSFET2. When the MOSFET2 is in a conducting state, energy is stored (magnetic flux occurs in the iron core) in a primary wiring of each of the transformers TR1 and TR2, and a clockwise current in FIG. 2 flows through a loop including the secondary winding of the transformer TR1 and the primary winding of the transformer TR2. In this state, a plus-side terminal of the secondary winding of the transformer TR2 is a terminal on the black point side of the secondary winding of the transformer TR2 in FIG. 2, and no current flows therethrough with the diode D3.

When the MOSFET2 is in an off state, the stored energy is transmitted to the secondary winding of the transformer TR1 and the secondary winding of the transformer TR2. A counterclockwise current in FIG. 2 flows through the loop including the secondary winding of the transformer TR1 and the primary winding of the transformer TR2. In this state, a plus-side terminal of the secondary winding of the transformer TR2 is a terminal on a side opposite to the black point side of the secondary winding of the transformer TR2 in FIG. 2, a current flows through the secondary winding of the transformer TR2 via the diode D3, and the capacitor C3 is charged. As a result, power is supplied to the SW element driving circuit 16. As described above, an alternating-current voltage is generated in the output terminal (the secondary side of the transformer TR1) of the insulating power supply 12. The configuration of the SW element driving power supply unit 14 is the same as the configuration of the SW element driving power supply unit 15.

Transformers with a gap can be suitably used as the transformers TR1 and TR2. Because gapped transformers include an iron core gap and have an inductance smaller than that of ordinary transformers, gapped transformers easily transmit a current and easily store energy. For this reason, gapped transformers are suitable for flyback power supplies.

FIG. 3 is a diagram illustrating a configuration example of the SW element driving circuit 16.

An amplifier 18 is supplied with a terminal voltage of the capacitor C3 as a power supply voltage. The amplifier 18 receives and amplifies a control signal S1 such as a PWM signal, and supplies an output signal to the gate of the switching element SW1 via a resistor R10, to drive the switching element SW1. The configuration of the SW element driving circuit 17 is the same as the configuration of the SW element driving circuit 16.

The voltage of the capacitor C3 is fed back to the IC1 through an insulating amplifier IC4. The insulating amplifier IC4 is a circuit that optically transmits a signal, such as a photocoupler. The input side and the output side of the insulating amplifier IC4 are electrically insulated. The IC1 drives and controls the MOSFET2 such that the voltage of the capacitor C3 is fixed. The output of the IC1 is a rectangular wave, and the duty thereof changes according to the input voltage. Specifically, when the voltage of the capacitor C3 exceeds the predetermined value, the IC1 reduces the duty thereof. When the voltage of the capacitor C3 is lower than the predetermined value, the IC1 increases the duty thereof. The transformer TR2 may be provided with a tertiary winding as illustrated in FIG. 4. In such a case, the IC1 may be controlled through the insulating amplifier IC4 to fix the direct-current voltage obtained by rectifying the alternating-current voltage generated in the tertiary winding with a diode D7 and a capacitor C10. In addition, the voltage of the capacitor C10 may be directly fed back to the IC1 without going through the insulating amplifier IC4, because the windings of the transformers TR2 are electrically insulated. The control signal that is transmitted to the MOSFET2 from the IC1 is transmitted to the insulating power supplies 11 and 13 with the digital isolator IC3. The digital isolator IC3 is a circuit that transmits a signal using magnetic coupling. The input side and the output side of the digital isolator IC3 are electrically insulated.

A resistor R3, a capacitor C4, and a diode D4 of each of the insulating power supplies 11, 12, and 13 are constituent elements of a snubber circuit in the insulating power supply.

The snubber circuit consumes the energy stored in the leakage inductance of the transformer TR1, to restrict the voltage applied to the MOSFET2. In the same manner, a resistor R4, a capacitor C5, and a diode D5 of the SW element driving power supply unit 14 are constituent elements of a snubber circuit of the SW element driving power supply unit. The snubber circuit consumes the energy stored in the leakage inductance of the transformer TR2.

The tertiary winding of the transformer TR1 charges a capacitor C6 with the energy emitted from the transformer TR1 through a diode D5A, to supply the power supply power to the IC1, IC2, and IC3. Accordingly, when the flyback power supply is started, no power supply is necessary through the resistor R2 and the MOSFET1.

A resistor R5, a Zener diode ZD3, and a transistor T1 are constituent elements of the charge stopping circuit. The resistor R5 and the Zener diode ZD3 sense a rise in voltage of the capacitor C6. When the voltage exceeds the Zener voltage of the Zener diode ZD3, the transistor T1 is changed to a conducting state, the potential between the gate and the source of the MOSFET1 is changed to 0, and the MOSFET1 is turned off. Accordingly, power supply through the resistor R2 is stopped. In this state, the diode D1 avoids electric discharge from the capacitor C2. By the operation of this circuit, no current flows through the resistor R2 at the input direct-current power supply voltage (startup voltage) of 100 V. For this reason, when the resistance value of the resistor R2 is R2, the wattage of the resistor R2 should be $100 \text{ V}^2/\text{R2}$ at maximum. In the present embodiment, because the input direct-current power supply voltage increases to 700 V at maximum, a current continues to flow through the resistor R2 in the case where no charge stopping circuit is included, and the wattage is required to be set to $700 \text{V}^2/\text{R2}$. Accordingly, the charge stopping circuit has the effect of reducing the wattage of the resistor R2. The diode D6 is set to prevent the startup power from flowing into the capacitor C6. As described above, the present embodiment enables efficient conversion of the main circuit voltage of the power converter into a switching element driving voltage (power supply voltage of the SW element driving circuits 16 and 17) for power conversion.

A resistor R6, a Zener diode ZD4, and a photocoupler PC1 are constituent elements of an overvoltage protection circuit. A photodiode of the photocoupler PC1 is connected with a resistor R9 serving as a collector load. When the MOSFET2 has an open circuit failure, power supply is stopped in the insulating power supply 12. This causes an increase in voltage of the capacitor C7. When the voltage of the capacitor C7 exceeds the Zener voltage of the Zener diode ZD4, a current flows through an input diode of the photocoupler PC1, an output transistor of the photocoupler PC1 is turned on, and a stop signal is transmitted to the IC1. In this state, the control signal that is transmitted to the insulating power supplies 11 and 13 from the IC1 through the IC3 is stopped, and all the insulating power supplies 11, 12, and 13 are stopped. This avoids imbalance in the input voltage.

A transistor T2 and a resistor R7 suppress an overcurrent of the MOSFET2. When the current of the MOSFET2 increases, the voltage drop of the resistor R7 increases, the transistor T2 is turned on, and the voltage between the gate and the source of the MOSFET2 is reduced. As a result, the current flowing through the MOSFET2 is suppressed, and thereby breakage of the overcurrent of the MOSFET2 is avoided.

The insulating power supplies 11 and 13 that function as slaves have a configuration in which IC1 and IC3 are not included, in comparison with the insulating power supply 12. The circuits of the insulating power supplies 11 and 13 other than the IC1 and IC3 have the same structure and function as those of the insulating power supply 12. The insulating power supplies 11 and 13 drive the MOSFET2 of the respective insulating power supplies 11 and 13 with a control signal transmitted from the insulating power supply 12 through the IC3. As a result, the insulating power supplies 11, 12, and 13 output alternating-current voltages of the same phase. This structure achieves voltage balance between the input capacitors C7, C8, and C9 of the insulating power supplies 11, 12, and 13. For example, when the voltage of the input capacitor C7 of the insulating power supply 12 increases, the power supplied by the insulating power supply 12 becomes larger than those of the insulating power supplies 11 and 13, because the same control signal is used in the insulating power supplies 11, 12, and 13. For this reason, the current with which the input capacitor C7 is charged is reduced, the voltage decreases, and voltage balance is achieved. The outputs of the photocouplers in the overvoltage protection circuits formed in the slave insulating power supplies 11 and 13 are connected with the output of the photocoupler PC1 of the insulating power supply 12, and input to the IC1. Accordingly, when the direct-current input voltage of any one of the insulating power supplies 11, 12, and 13 becomes an overvoltage, the output of the photocoupler PC1 becomes 0, an operation stop signal (low level signal) is output from the IC1, and the operation of the MOSFET2 is stopped. Simultaneously, the low level signal is transmitted to the insulating power supplies 11 and 13 via the IC3, and the operations of the insulating power supplies 11 and 13 are also stopped.

(Effects)

Because a plurality of insulating power supplies are connected in series on the direct-current input side and connected to a high-voltage direct-current power supply, a voltage applied to each insulating power supply is reduced, and the withstand voltage of the MOSFET used for power conversion can be reduced. This structure enables use of MOSFETs as general-purpose products. In addition, as the control circuit power supply such as the control circuit of the MOSFET used for power conversion in each of the insulating power supplies or the overcurrent protection circuit, a low input power supply voltage (100 V) is dropped with a resistor and used as the power supply voltage only in startup. In an ordinary operation with a high input power supply voltage (700 V), no voltage drop resistor is used, but a voltage generated in the tertiary winding of the transformer is used as a control circuit power supply. This structure enables a reduction in wattage of the voltage drop resistor to generate the control circuit power supply. Specifically, this structure enables efficient conversion of the main circuit voltage of the power converter into a driving voltage (the power supply voltage of the SW element driving circuits 16 and 17) of the power conversion switching elements.

While a certain embodiment has been described, this embodiment has been presented by way of example only, and is not intended to limit the scope of the inventions. Indeed, the novel embodiment described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching element driving power supply circuit converting a main circuit voltage of a power converter into a drive voltage of power conversion switching elements, comprising:
 a plurality of insulating power supplies having respective direct-current input circuit ends connected in series, respective input-side circuits and output-side circuits insulated from each other, and respective output circuit ends connected in parallel; and
 a plurality of switching element driving power supply units that are connected in parallel with the output circuit ends connected in parallel, and supplying power to gate driving circuits of the power conversion switching elements of the power converter.

2. The switching element driving power supply circuit according to claim 1, wherein
 each of the output-side circuits of the insulating power supplies includes:
 a first transformer; and
 a first switching element that drives a primary winding of the first transformer, and
 the respective first switching elements of the insulating power supplies are controlled with an identical control signal.

3. The switching element driving power supply circuit according to claim 2, wherein secondary windings of the respective first transformers of the output-side circuits of the insulating power supplies are mutually connected in parallel.

4. The switching element driving power supply circuit according to claim 3, wherein
 each of the switching element driving power supply units includes a second transformer,
 a primary side of each of the second transformers is connected to the output circuit ends of the insulating power supplies,
 a secondary side of each of the second transformers is connected to a series circuit including a diode and a capacitor, and
 the switching element driving power supply units output a plurality of direct-current voltages that are mutually insulated.

5. The switching element driving power supply circuit according to claim 4, wherein the second transformer of each of the switching element driving power supply units includes a gapped transformer.

6. The switching element driving power supply circuit according to claim 4, wherein the primary side of the second transformer of each of the switching element driving power supply units includes a snubber circuit.

7. The switching element driving power supply circuit according to claim 2, wherein
 each of the insulating power supplies includes a control circuit that operates with a power supply voltage lower than an input power supply voltage of the insulating power supplies, and
 the power supply voltage of the control circuit is obtained by dropping the input power supply voltage of the insulating power supplies with a resistor in startup.

8. The switching element driving power supply circuit according to claim 2, wherein
 one of the insulating power supplies is configured as a master insulating power supply,
 the master insulating power supply includes a control circuit that controls the first switching element that drives the primary winding of the first transformer, and
 the control signal that controls the first switching element is transmitted as a control signal that controls the first switching elements of the other insulating power supplies using a digital isolator.

9. The switching element driving power supply circuit according to claim 7, wherein
 each of the first transformers includes a tertiary winding, and
 after each of the insulating power supplies is started, power supply with the resistor and the switching element is stopped using a power supply stop circuit, and the power supply voltage is supplied to the control circuit using a voltage generated in the tertiary winding.

10. The switching element driving power supply circuit according to claim 2, wherein each of the insulating power supplies includes a current suppression circuit that suppresses a current flowing through the first switching element.

11. The switching element driving power supply circuit according to claim 2, wherein each of the insulating power supplies includes an overcurrent protection circuit that prevents an overcurrent from flowing through the first switching element.

12. The switching element driving power supply circuit according to claim 1, further comprising an overvoltage protection circuit that prevents an overvoltage of the power supply voltage of each of the insulating power supplies.

* * * * *